(12) United States Patent
Lesso et al.

(10) Patent No.: US 11,958,075 B2
(45) Date of Patent: Apr. 16, 2024

(54) DRIVER CIRCUITRY

(71) Applicant: Cirrus Logic International Semiconductor Ltd., Edinburgh (GB)

(72) Inventors: John P. Lesso, Edinburgh (GB); Toru Ido, Tokyo (JP)

(73) Assignee: Cirrus Logic Inc., Austin, TX (US)

( * ) Notice: Subject to any disclaimer, the term of this patent is extended or adjusted under 35 U.S.C. 154(b) by 499 days.

(21) Appl. No.: 17/092,613

(22) Filed: Nov. 9, 2020

(65) Prior Publication Data

US 2022/0143651 A1  May 12, 2022

(51) Int. Cl.
*H03K 17/30* (2006.01)
*B06B 1/02* (2006.01)
*B06B 1/06* (2006.01)

(52) U.S. Cl.
CPC .............. *B06B 1/0223* (2013.01); *B06B 1/06* (2013.01); *H03K 17/30* (2013.01); *B06B 2201/55* (2013.01)

(58) Field of Classification Search
CPC ..................................................... H03K 17/30
See application file for complete search history.

(56) References Cited

U.S. PATENT DOCUMENTS

| | | | | |
|---|---|---|---|---|
| 9,718,374 B2 * | 8/2017 | Tang | ...................... | H02J 7/0063 |
| 11,664,723 B2 * | 5/2023 | Liu | ......................... | H02M 1/14 |
| | | | | 320/137 |
| 2003/0142513 A1 * | 7/2003 | Vinciarelli | .............. | H02J 1/102 |
| | | | | 363/17 |
| 2013/0334987 A1 | 12/2013 | Garg et al. | | |
| 2017/0302193 A1 * | 10/2017 | Zhang | ...................... | H02M 1/08 |
| 2020/0244171 A1 * | 7/2020 | Chaput | .................. | H02M 3/157 |
| 2023/0130908 A1 * | 4/2023 | Stolt | ....................... | H02N 2/067 |
| | | | | 310/317 |

FOREIGN PATENT DOCUMENTS

EP    3098950 A1    11/2016

OTHER PUBLICATIONS

International Search Report and Written Opinion of the International Searching Authority, International Application No. PCT/GB2021/052210, dated Nov. 19, 2021.

* cited by examiner

*Primary Examiner* — Sibin Chen
(74) *Attorney, Agent, or Firm* — Jackson Walker L.L.P.

(57) ABSTRACT

The present disclosure relates to circuitry for driving a load. The circuitry comprises driver circuitry configured to generate a drive signal, based on an input signal to the driver circuitry, for driving the load, and commutator circuitry for coupling the driver circuitry to the load. The commutator circuitry is configured to alternate between commutation states in response to a level of the drive signal meeting a drive signal threshold or in response to a level of the input signal meeting a first input signal threshold. The circuitry is configured to apply an offset to the input signal when the input signal is below a second input signal threshold so as to increase a minimum level of the drive signal above the drive signal threshold or to increase a minimum level of the input signal above the first input signal threshold.

20 Claims, 11 Drawing Sheets

Figure 11a

DRIVER CIRCUITRY

FIELD OF THE INVENTION

The present disclosure relates to driver circuitry, and in particular to driver circuitry for piezoelectric transducers or other capacitive loads.

BACKGROUND

Piezoelectric transducers are increasingly being seen as a viable alternative to transducers such as speakers and resonant actuators for providing audio and/or haptic outputs in devices such as mobile telephones, laptop and tablet computers and the like, due to their thin form factor, which may be beneficial in meeting the demand for increasing functionality in such devices without significantly increasing their size. Piezoelectric transducers are also increasingly finding application as transducers for ultrasonic sensing and range-finding systems.

SUMMARY

According to a first aspect, the invention provides circuitry for driving a load, the circuitry comprising:
  driver circuitry configured to generate a drive signal, based on an input signal to the driver circuitry, for driving the load; and
  commutator circuitry for coupling the driver circuitry to the load, wherein the commutator circuitry is configured to alternate between commutation states in response to a level of the drive signal meeting a drive signal threshold or in response to a level of the input signal meeting a first input signal threshold,
  wherein the circuitry is configured to apply an offset to the input signal when the input signal is below a second input signal threshold so as to increase a minimum level of the drive signal above the drive signal threshold or to increase a minimum level of the input signal above the first input signal threshold.

The load may comprise a capacitive load.

The load may comprise a piezoelectric transducer.

The second input signal threshold is dependent upon an expected maximum level of the drive signal.

The second input signal threshold may be such that the commutator circuitry remains in a single commutation state until the level of the drive signal is within 6 dB of the expected maximum level of the drive signal.

The offset may be a fixed offset.

Alternatively, the offset may be variable according to a level of the input signal.

The circuitry may further comprise level detector circuitry configured to detect a level of the input signal.

The level detector circuitry may comprise envelope detector circuitry configured to detect an envelope of the input signal.

The circuitry may further comprise a summing node configured to receive the input signal and an offset signal output by the level detector circuitry and to output a signal to the driver circuitry.

The circuitry may further comprise control circuitry configured to control operation of the commutator circuitry.

The control circuitry may comprise:
  level detector circuitry configured to output a control signal to the commutator circuitry each time the level of the drive signal meets the drive signal threshold.

The control circuitry may comprise:
  level detector circuitry configured to output a control signal to the commutator circuitry each time the level of the input signal meets the first input signal threshold.

The driver circuitry may be selectively configurable to generate a drive signal that is shaped to take into account the effect of commutation of the drive signal that occurs when the level of the drive signal meets the drive signal threshold.

The level detector circuitry may be configured to output a control signal to control the configuration of the driver circuitry based on the detected level of the input signal.

The circuitry may further comprise controllable compressor circuitry configured to apply a controllable gain to the input signal so as to control a rate of change of the offset applied to the input signal, the controllable gain based on a level of the input signal.

According to a second aspect, the invention provides circuitry for driving a load, the circuitry comprising:
  driver circuitry configured to generate a drive signal, based on an input signal to the driver circuitry, for driving the load;
  commutator circuitry configured to commutate the drive signal between first and second terminals of the load,
  wherein the circuitry is configured to prevent commutation of the drive signal when a level of the input signal is below a threshold.

According to a third aspect, the invention provides circuitry for driving a load, the circuitry comprising:
  driver circuitry configured to generate a drive signal, based on an input signal to the driver circuitry, for driving the load;
  level detector circuitry configured to detect a level of the drive signal or a level of the input signal; and
  commutator circuitry for supplying the drive signal to either a first terminal or a second terminal of the load based on an output of the level detector circuitry,
  wherein the circuitry is configured to apply an offset to the input signal when the level of the input signal is below a predetermined input signal threshold.

According to a fourth aspect, the invention provides circuitry for driving a load, the circuitry comprising:
  driver circuitry configured to generate a drive signal, based on an input signal to the driver circuitry, for driving the load,
  wherein the circuitry is configured to apply an offset to the input signal, and
  wherein the offset is a function of the input signal level.

The circuitry may further comprise level detector circuitry configured to detect a level of the input signal and to control the offset based on the detected level of the input signal.

The level detector circuitry may comprise envelope detector circuitry configured to detect an envelope of the input signal.

The circuitry may further comprise a summing node configured to receive the input signal and an offset signal output by the level detector circuitry and to output a signal to the driver circuitry.

The circuitry may further comprise controllable compressor circuitry configured to apply a controllable gain to the input signal so as to control a rate of change of the offset applied to the input signal, the controllable gain based on a level of the input signal.

According to a fifth aspect the invention provides an integrated circuit comprising the circuitry of any of the first to fourth aspects.

According to a sixth aspect the invention provides a device comprising the circuitry of any of the first to fourth aspects. The device may comprise, for example, a mobile telephone, a tablet or laptop computer, a gaming device, an accessory device, a headset, headphones, earphones, a smart speaker.

BRIEF DESCRIPTION OF THE DRAWINGS

Embodiments of the invention will now be described, strictly by way of example only, with reference to the accompanying drawings, of which.

DETAILED DESCRIPTION

Figure 1:
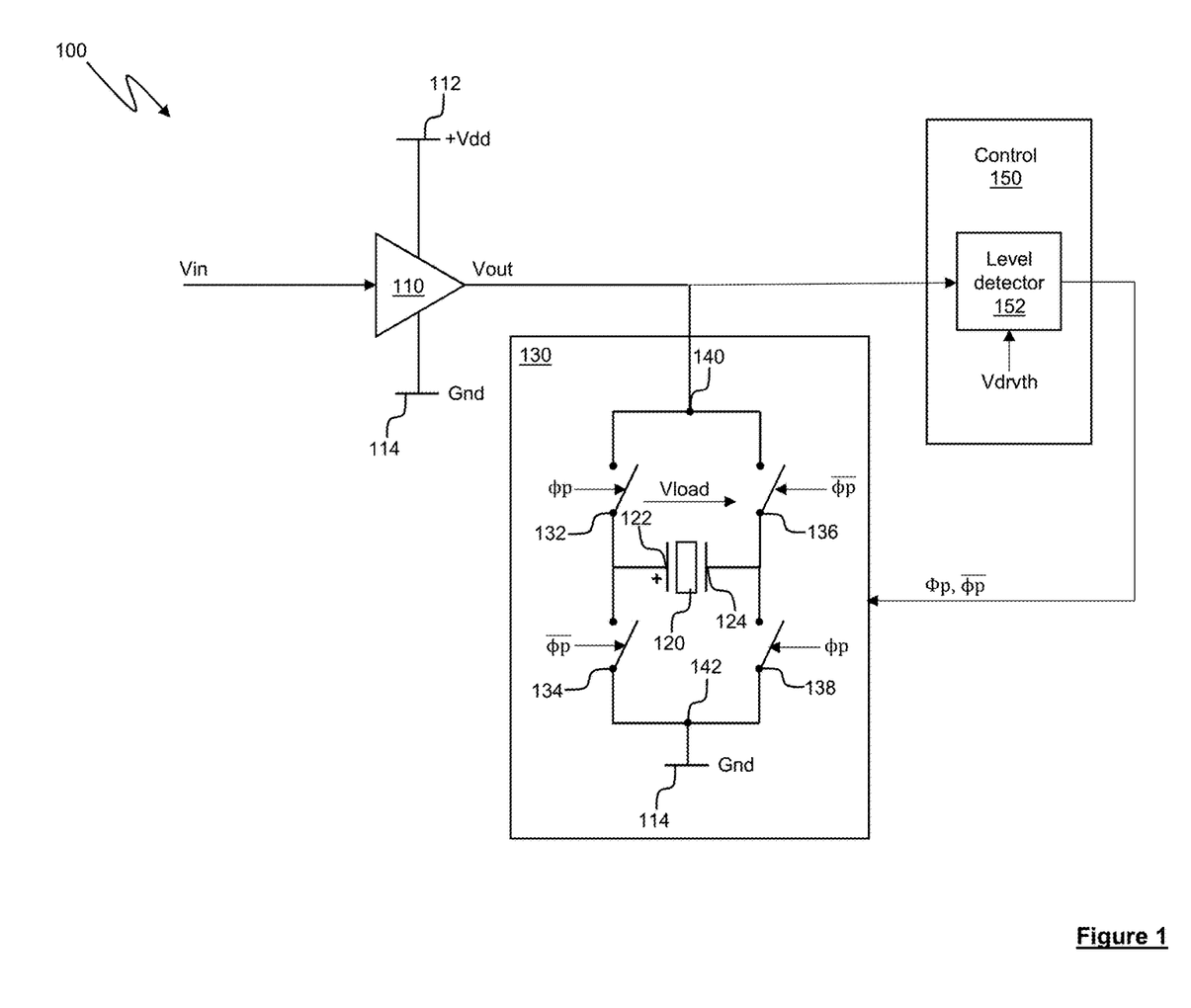
FIG. 1 is a schematic diagram illustrating example circuitry for driving a load such as a piezoelectric transducer.

FIG. 1 is a schematic diagram illustrating example circuitry for driving a load such as a piezoelectric transducer. The circuitry, shown generally at 100 in FIG. 1, includes driver circuitry 110, which in this example receives a power supply from positive (+Vdd) and ground (Gnd) power supply rails 112, 114. The driver circuitry 110 receives an input signal Vin and generates a drive signal Vout, based on the input signal, for driving a piezoelectric transducer 120.

The circuitry 100 further includes commutator circuitry 130, which in the illustrated example includes first to fourth controllable switches 132-138. The commutator circuitry 130 is coupled to control circuitry 150 so as to receive control signals ϕp, $\overline{\phi p}$ for controlling the operation of the controllable switches 132-138, as will be described in more detail below.

The first controllable switch 132 is coupled between a first node 140 of the commutator circuitry 130 and a first terminal 122 of the piezoelectric transducer 120. The first node 140 of the commutator circuitry 130 is coupled to an output of the driver circuitry 110 so as to receive the drive signal Vout.

The second controllable switch 134 is coupled between the first terminal 122 of the piezoelectric transducer 120 and the ground voltage supply rail 114.

The third controllable switch 136 is coupled between the first node 150 of the commutator circuitry 130 and a second terminal 124 of the piezoelectric transducer 120.

The fourth controllable switch 138 is coupled between the second terminal 124 of the piezoelectric transducer 120 and the ground voltage supply rail 114.

By selectively opening and closing the controllable switches 132-138, one of the first and second terminals 122, 124 of the piezoelectric transducer 120 can be coupled to the output of the driver circuitry 110, and the other of the first and second terminals 122, 124 of the piezoelectric transducer 120 can be coupled to the ground voltage supply rail 114.

Figure 2A:
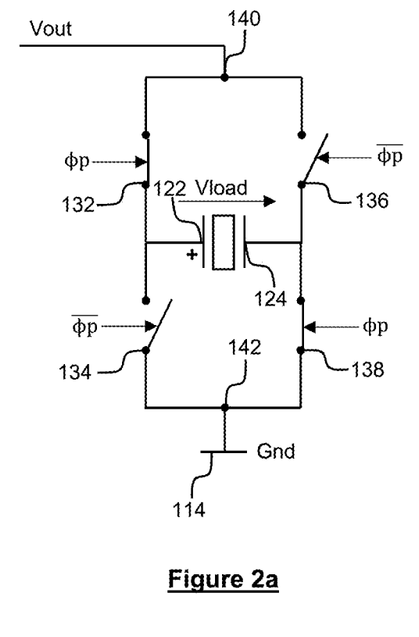
FIGS. 2a and 2b illustrate different commutation states of the circuitry of FIG. 1.

As shown in FIG. 2a, when the control signal ϕp causes the first and fourth switches 132, 138 to close, the control signal $\overline{\phi p}$ (which is the inverse of the control signal ϕp) causes the second and third switches 134, 136 to open, thus coupling the first terminal 122 of the piezoelectric transistor 122 to the output of the driver circuitry 110 so as to receive the drive signal Vout, and the second terminal 124 to the ground supply voltage rail 114. Thus in the configuration or commutation state shown in FIG. 2a the voltage Vload across the piezoelectric transducer is equal to Vout.

Figure 2B:
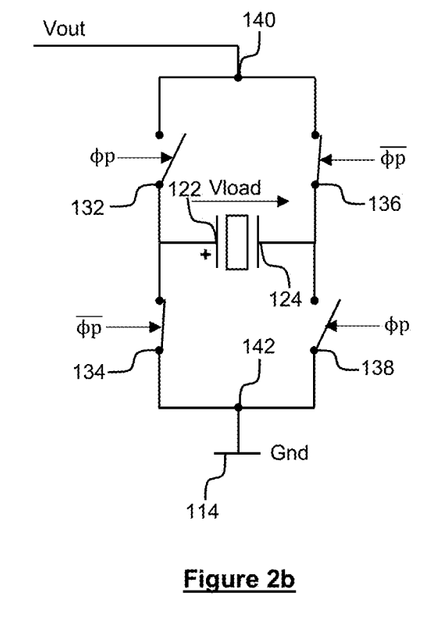

As shown in FIG. 2b, when the control signal ϕp causes the first and fourth switches 132, 138 to open, the control signal $\overline{\phi p}$ causes the second and third switches 134, 136 to close, thus coupling the first terminal 122 of the piezoelectric transistor 122 to the ground supply voltage rail 114, and the second terminal 124 to the output of the driver circuitry 110 so as to receive the drive signal Vout. Thus in the configuration or commutation state shown in FIG. 2a the voltage Vload across the piezoelectric transducer is equal to −Vout.

The control circuitry 150 may comprise, for example, level detector circuitry 152 configured to receive the drive signal Vout and a drive signal threshold Vdrvth, and to output the control signals ϕp and $\overline{\phi p}$ each time the level of the drive signal Vout meets or crosses the drive signal threshold Vdrvth. The values of the control signals ϕp and $\overline{\phi p}$ alternate each time the level of the drive signal Vout meets or crosses the drive signal threshold Vdrvth such that, for example, the first time the level of the drive signal Vout meets or crosses the drive signal threshold Vdrvth, the value of the control signal ϕp is low or logic 0 and the value of the control signal $\overline{\phi p}$ is high or logic 1, and the second time the level of the drive signal Vout meets or crosses the drive signal threshold Vdrvth, the value of the control signal ϕp is high or logic 1 and the value of the control signal $\overline{\phi p}$ is low or logic 0.

The operation of the controllable switches 132-138 is thus controlled by the control circuitry 150 based on a level of the drive signal Vout, such that each time the level of the drive signal Vout meets or crosses the drive signal threshold value, which in this example is 0 volts, the commutator circuitry 130 couples the output of the driver circuitry 110 to a different one of the first and second terminals 122, 124 of the piezoelectric transducer 120.

For example, if in a first phase of operation the first and fourth switches 132, 138 are closed and the second and third switches 134, 136 are open (i.e. the commutator circuitry 130 adopts the commutation state shown in FIG. 2a), in a second phase of operation, which is triggered when the level of the drive signal Vout meets or crosses the drive signal threshold value, the second and third switches 134, 136 are closed and the first and fourth switches 132, 138 are opened (i.e. the commutator circuitry 130 adopts the commutation state shown in FIG. 2b). In a subsequent third phase of operation, which is triggered the next time the level of the drive signal Vout meets or crosses the drive signal threshold value, the first and fourth switches 132, 138 are again closed and the second and third switches 134, 136 are again opened (i.e. the commutator circuitry 130 again adopts the commutation state shown in FIG. 2*a*).

Thus, the commutator circuitry 130 is configured to commutate the drive signal Vout between the first and second terminals 122, 124 of the piezoelectric transducer 120 on alternate drive signal threshold crossings of the drive signal Vout.

Figure 3:
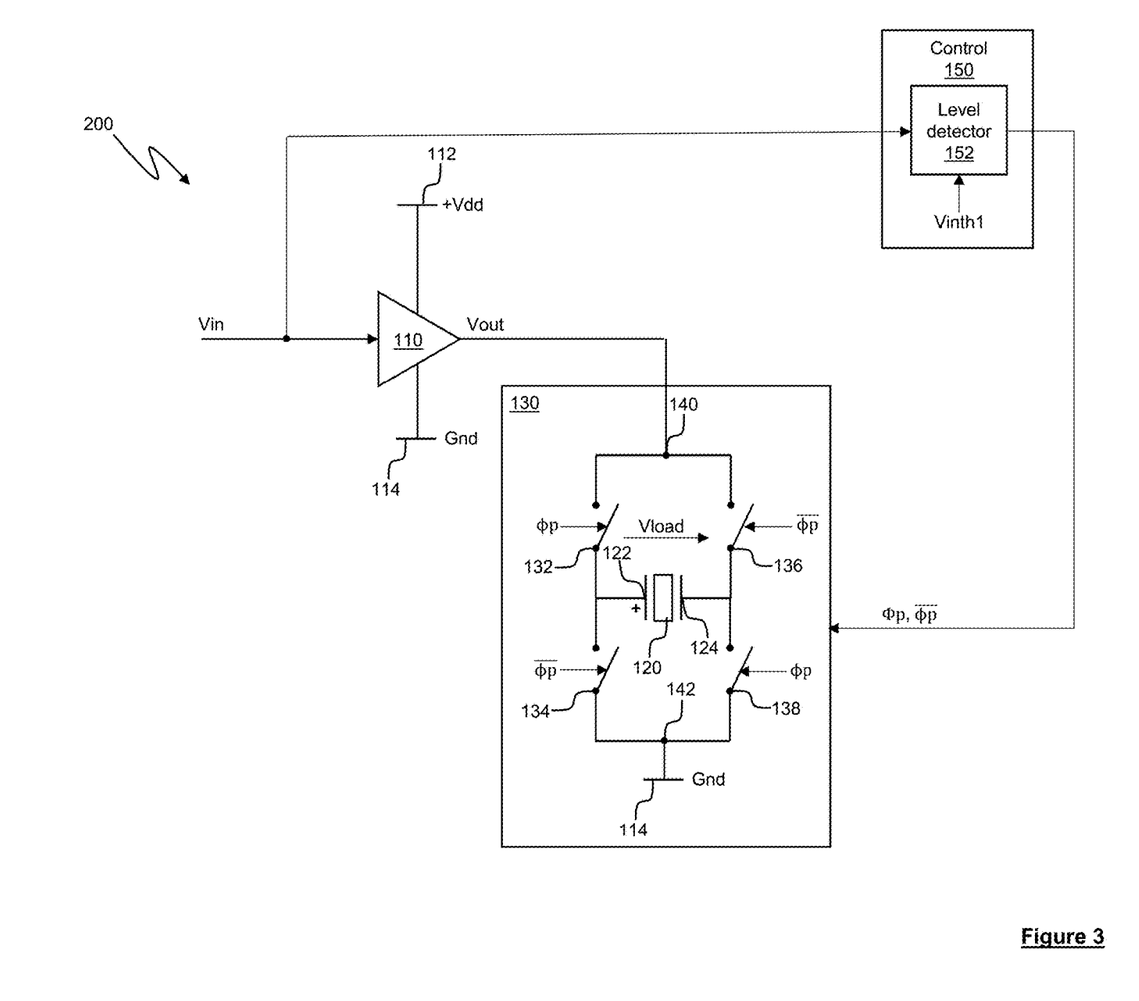
FIG. 3 is a schematic diagram illustrating alternative example circuitry for driving a load such as a piezoelectric transducer.

In an alternative arrangement, shown generally at 200 in FIG. 3, the level detector circuitry 152 is configured to receive the input signal Vin and a first input signal threshold Vinth1, and to output the control signals φp and $\overline{\phi p}$ each time the level of the input signal Vin meets or crosses the first input signal threshold Vinth1. The values of the control signals φp and $\overline{\phi p}$ alternate each time level of the input signal Vin meets or crosses the first input signal threshold Vinth1 such that, for example, the first time the level of the input signal Vin meets or crosses the first input signal threshold Vinth1, the value of the control signal φp is low or logic 0 and the value of the control signal $\overline{\phi p}$ is high or logic 1, and the second time the level of the input signal Vin meets or crosses the first input signal threshold Vinth1, the value of the control signal φp is high or logic 1 and the value of the control signal $\overline{\phi p}$ is low or logic 0.

The operation of the controllable switches 132-138 in the alternative arrangement of FIG. 2 is thus controlled by the control circuitry 150 based on a level of the input signal Vin, such that each time the level of the input signal Vin meets or crosses the first input signal threshold value Vinth1, which in this example is 0 volts, the commutator circuitry 130 couples the output of the driver circuitry 110 to a different one of the first and second terminals 122, 124 of the piezoelectric transducer 120.

For example, if in a first phase of operation the first and fourth switches 132, 138 are closed and the second and third switches 134, 136 are open (i.e. the commutator circuitry 130 adopts the commutation state shown in FIG. 2*a*), in a second phase of operation, which is triggered when the level of the input signal Vin meets or crosses the first input signal threshold value Vinth1, the second and third switches 134, 136 are closed and the first and fourth switches 132, 138 are opened (i.e. the commutator circuitry 130 adopts the commutation state shown in FIG. 2*b*). In a subsequent third phase of operation, which is triggered the next time the level of the input signal Vin meets or crosses the first input signal threshold value Vinth1, the first and fourth switches 132, 138 are again closed and the second and third switches 134, 136 are again opened (i.e. the commutator circuitry 130 again adopts the commutation state shown in FIG. 2*a*).

Thus, the commutator circuitry 130 is configured to commutate the drive signal Vout between the first and second terminals 122, 124 of the piezoelectric transducer 120 on alternate first input signal threshold crossings of the input signal Vin. The first input signal threshold Vinth1 is determined or selected such that the commutation of the drive signal Vout based on the level of the input signal Vin has the same effect as commutation of the drive signal Vout based on the level of the drive signal Vout in the arrangement shown in FIG. 2. For example, if the drive signal threshold Vdrvth in the arrangement of FIG. 2 is 0 v, then the same commutation effect can be achieved in the arrangement of FIG. 3 by setting the first input signal threshold Vinth1 to 0 v. However, if the drive signal threshold Vdrvth in the arrangement of FIG. 2 has a value other than 0 v, then the same commutation effect can be achieved in the arrangement of FIG. 3 by setting the first input signal threshold Vinth1 to a value equivalent to Vdrvth scaled to take into account any gain applied by the driver circuitry 110.

As will be appreciated by those of ordinary skill in the art, the commutation arrangements 100, 200 shown in FIGS. 1 and 3 have the effect of doubling the effective voltage swing across the piezoelectric transducer 120. This effect is illustrated in FIG. 4, which shows examples of the driver circuitry drive signal Vout (trace 310), the control signal φp (trace 320) and the voltage Vload across the piezoelectric transducer 120 (trace 330) of the circuitry 100 over time.

Figure 4:
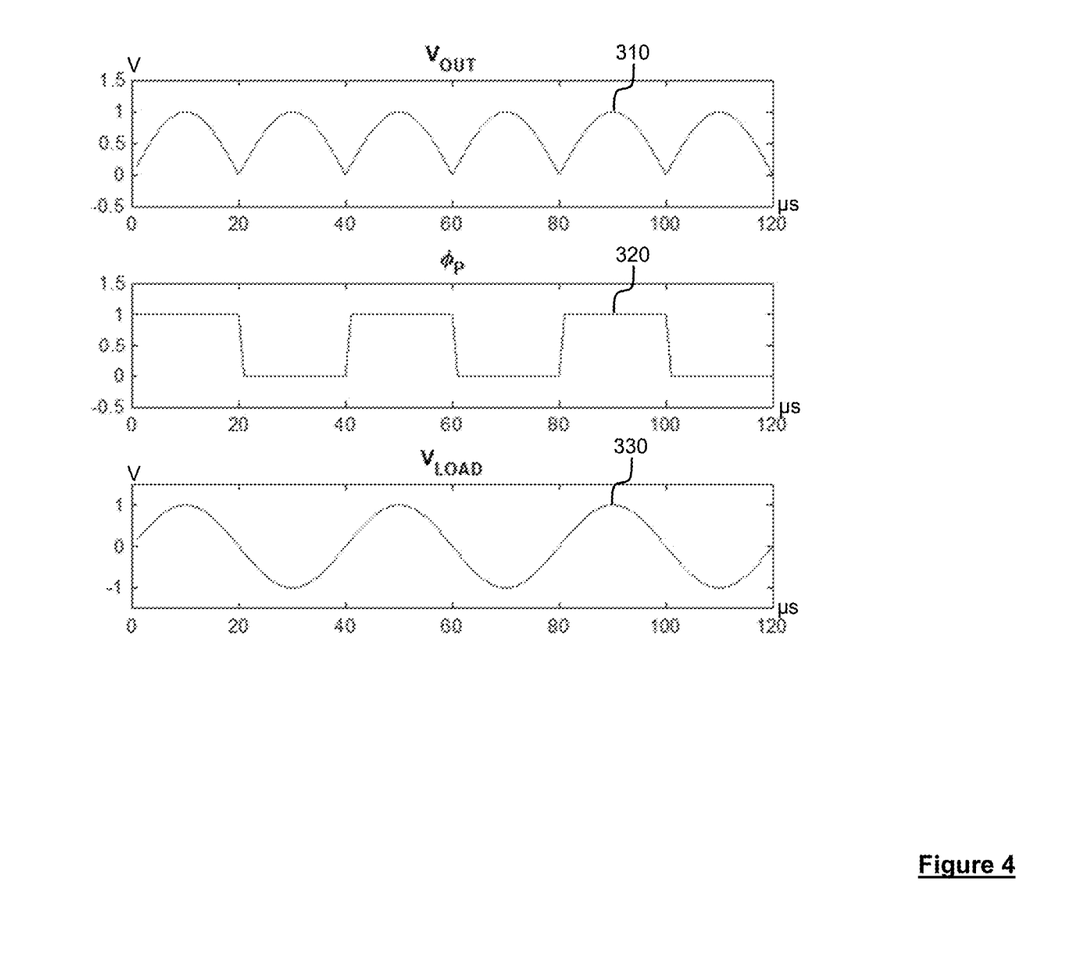
FIG. 4 illustrates a drive signal, a control signal and a voltage across a load during operation of the circuitry of FIG. 1 for a relatively large drive signal.

As can be seen in FIG. 4, during a first phase of operation of the circuitry 100 (from 0 to 20 μs) in which the drive signal Vout has a positive value, the control signal φp is high, such that the commutator circuitry 130 adopts the commutation state or configuration shown in FIG. 2*a*, and the voltage Vload across the piezoelectric transducer 120 follows the drive signal Vout, since Vload=Vout.

At around 20 μs the level of the drive signal Vout falls to 0V. At this point the control signal φp goes low, such that the circuitry 100 enters a second phase of operation in which the commutator circuitry 130 adopts the commutation state or configuration shown in FIG. 2*b*, and the voltage Vload across the piezoelectric transducer 120 is inverted with respect to the drive signal Vout, since Vload=−Vout.

At around 40 μs the level of the drive signal Vout again falls to 0V. At this point the control signal φp goes high again, such that the circuitry 100 enters a third phase of operation in which the commutator circuitry 130 returns to the commutation state or configuration shown in FIG. 2*a*, and the voltage Vload across the piezoelectric transducer 120 again tracks the drive signal Vout, since Vload=Vout.

Thus, the voltage swing of the voltage Vload across the piezoelectric transducer 120 over the first and second phases of operation of the circuitry 100 is effectively twice what it would be if no commutation of the output voltage Vout were to occur (assuming that the magnitude of Vout is equal in the first and second phases).

This effective doubling of the voltage swing across the piezoelectric transducer 120 is useful where large displacements of the piezoelectric transducer 120 are required, as such displacements can be produced using relatively small driver circuitry output signals.

Where smaller displacements of the piezoelectric transducer 120 are required, commutation of the drive signal Vout is not necessary, because the desired displacement can be produced using a smaller voltage swing across the piezoelectric transducer 120.

However, as the control circuitry 150 of the circuitry 100 of FIG. 1 triggers commutation each time the drive signal Vout meets the drive signal threshold, commutation still occurs in the circuitry 100 even when it is not required.

Figure 5:
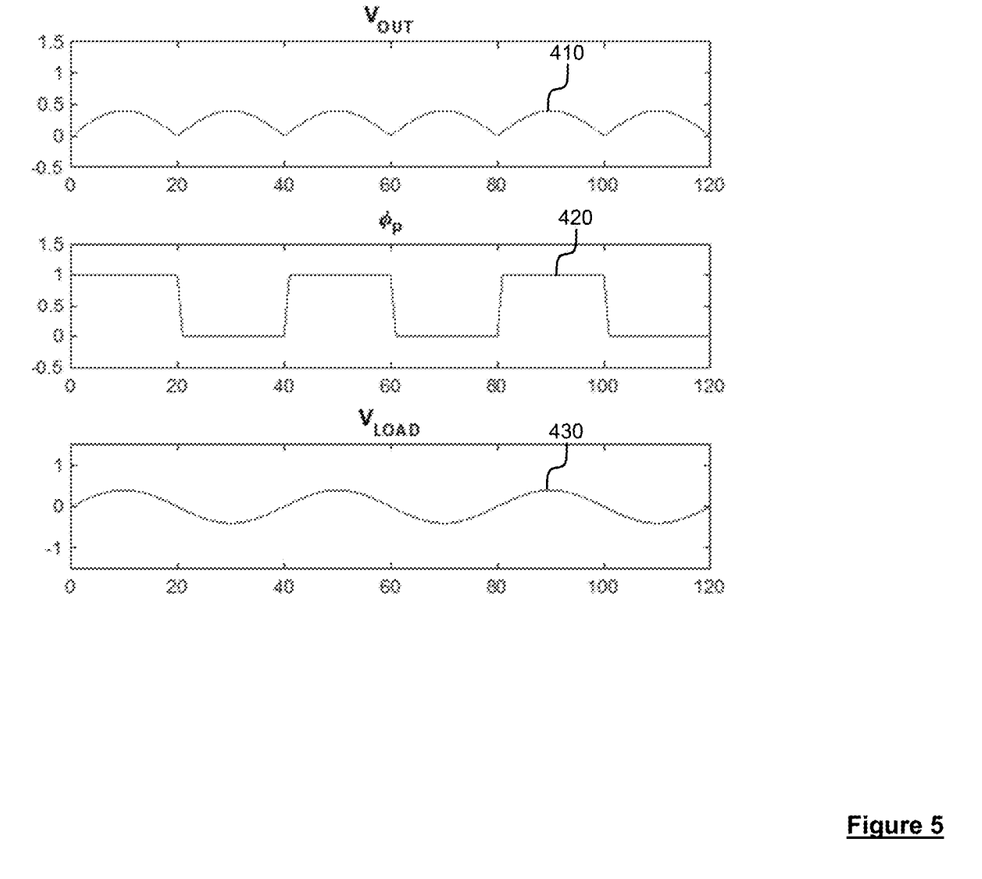
FIG. 5 illustrates a drive signal, a control signal and a voltage across a load during operation of the circuitry of FIG. 1 for a relatively small drive signal.

This is illustrated in FIG. 5, which shows examples of a driver circuitry drive signal Vout (trace 410) that is smaller than the example shown at 310 in FIG. 4, the control signal φp (trace 420) and the voltage Vload across the piezoelectric transducer 120 (trace 430) of the circuitry 100 over time. As can be seen, the control signal φp is the same for the smaller driver circuit output signal 410 as for the larger signal 310, which leads to a swing of the voltage Vload across the piezoelectric transducer 120 over the first and second phases of operation of the circuitry 100 that is effectively twice what it would be if no commutation of the output voltage Vout were to occur (assuming that the magnitude of Vout is equal in the first and second phases).

This unnecessary commutation leads to unnecessary switching losses, power consumption and noise.

Figure 6:
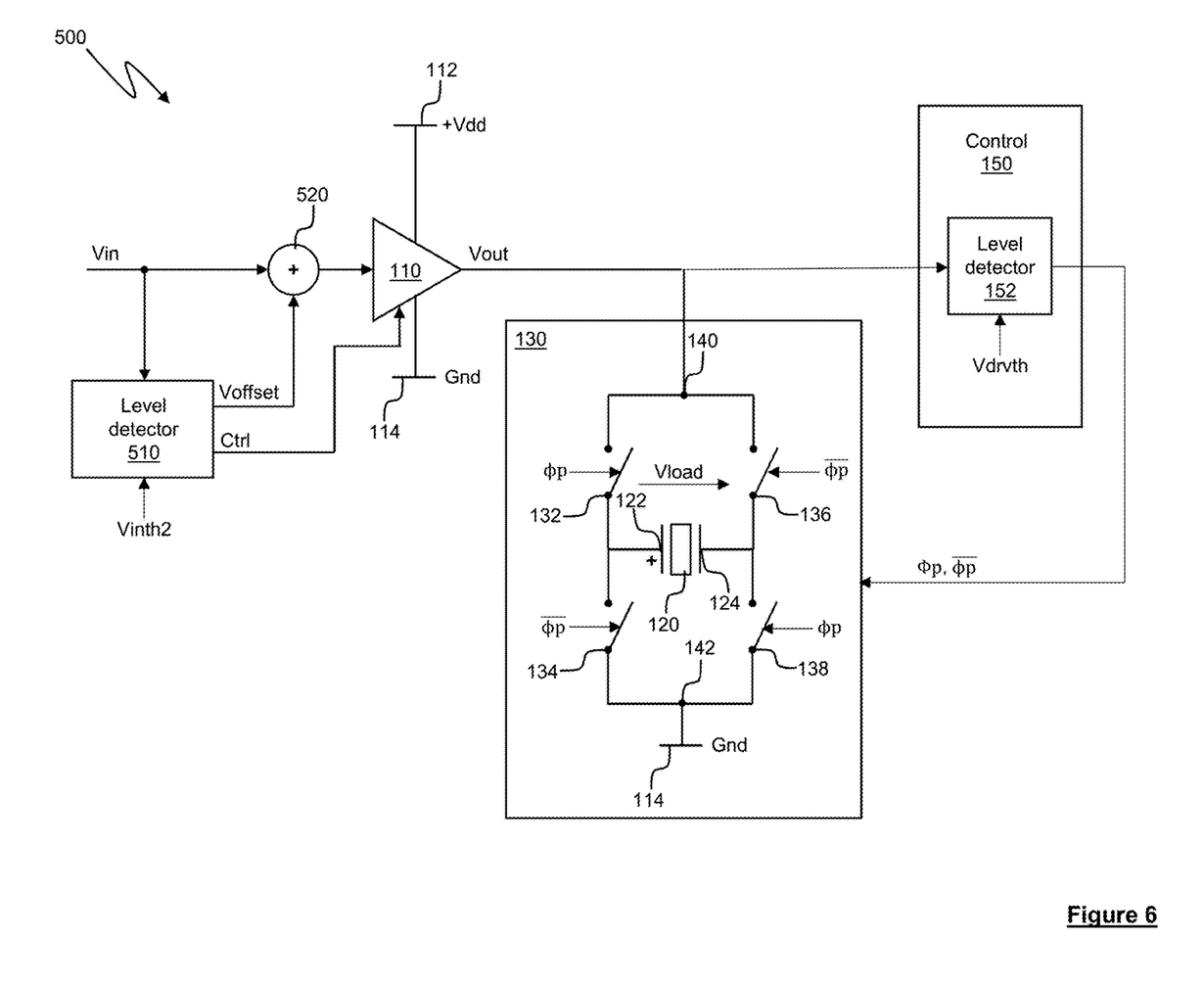
FIG. 6 is a schematic diagram illustrating example circuitry for driving a load such as a piezoelectric transducer according to the present disclosure.

FIG. 6 is a schematic diagram illustrating example circuitry for driving a load (in this example a piezoelectric transducer) according to the present disclosure. The circuitry, shown generally at 500 in FIG. 6, includes a number of elements in common with the circuitry 100 of FIG. 1. Such common elements are denoted by common reference numerals in FIGS. 1 and 6 and will not be described again in detail here. Although in the example shown in FIG. 6 the level detector circuitry 152 of the control circuitry 150 is shown as receiving the drive signal Vout and the drive signal threshold Vdrvth, as in the arrangement shown in FIG. 1, it will be appreciated by those skilled in the art that the level detector circuitry 152 could equally receive the input signal Vin and the first input signal threshold Vinth1, as described above with reference to FIG. 3.

The circuitry 500 includes second level detector circuitry 510 and a summing node 520. The summing node 520 is configured to receive, at a first input thereof, the input signal Vin, and at a second input thereof an offset signal Voffset output by the second level detector circuitry 510. An output of the summing node 520 is coupled to an input of the driver circuitry 110, such that the summing node outputs a signal Vin+Voffset to the driver circuitry 110. As will be recalled, the output Vout of the driver circuitry 110 is based on the signal input to the driver circuitry 110, and thus in the example illustrated in FIG. 5 the drive signal Vout is based on the signal Vin+Voffset that is input to the driver circuitry 110.

The second level detector circuitry 510, which may comprise, for example, envelope detector circuitry, is configured to receive the input signal Vin and to detect a level, e.g. an envelope, of the input signal Vin, and to compare the detected level of the input signal Vin to a second input signal threshold Vinth2. If the detected input signal level is equal to or greater than the second input signal threshold Vinth2, the second level detector circuitry 510 outputs no offset signal Voffset (or equivalently, outputs an offset signal Voffset of value 0 volts). If, however, the detected input signal level is less than the second input signal threshold Vinth2, the second level detector circuitry 510 outputs a positive DC offset signal Voffset, which is added to the input signal Vin by the summing node 520.

The purpose of the DC offset signal Voffset is to raise the level of the drive signal Vout such that a minimum level of the drive signal Vout is greater than the drive signal threshold Vdrvth that triggers commutation of the drive signal Vout, or equivalently (where commutation is based on the level of the input signal Vin, as in the arrangement shown in FIG. 3) to raise the level of the input signal Vin such that a minimum level of the input signal Vin is greater than the first input signal threshold Vinth1 that triggers commutation of the drive signal Vout. By raising the level of the output or input signal in this way, commutation can be effectively disabled for input signals Vin for which commutation is not necessary to achieve a desired displacement of the piezoelectric transducer 120, thereby avoiding unnecessary commutation and the attendant switching losses, power consumption and noise.

For example, where the input signal Vin is an audio signal, the DC offset signal Voffset can be applied as a function of the volume of the input audio signal. Thus if the level of the input signal Vin is lower than the second input signal threshold Vinth2, the DC offset signal can be applied to the input signal Vin to effectively disable commutation of the drive signal Vout. If the level of the input signal Vin increases to the extent that it meets or exceeds the second input signal threshold Vinth2, the DC offset signal Voffset is no longer applied to the input signal Vin and thus commutation of the drive signal Vout is enabled. If the level of the input signal Vin subsequently falls below the second input signal threshold Vinth2, the DC offset signal can again be applied to the input signal Vin, thus again effectively disabling commutation of the drive signal Vout.

The DC offset signal Voffset may be of a fixed level. Using a fixed DC offset ensures that the minimum level of the drive signal Vout is always greater than the drive signal threshold and thus does not trigger commutation. However, this can lead to a large difference between the minimum level of the drive signal Vout and the drive signal threshold, which can increase power consumption unnecessarily.

Thus it may be preferable for the DC offset signal Voffset to be variable according to the detected level of the input signal Vin. This allows the DC offset signal Voffset to be tailored to ensure that the minimum level of the drive signal Vout is just above the drive signal threshold Vdrvth, so as to avoid unnecessary commutation of the output signal, without unnecessarily increasing power consumption.

The second input signal threshold Vinth2 may be set such that commutation is prevented until the drive signal Vout is within 6 dB of an expected maximum or full-scale level of the drive signal Vout, i.e. the input signal threshold Vinth may be set such that commutation is prevented (e.g. the commutator circuitry 130 remains in a single commutation state) when a level, e.g. an amplitude or envelope, of the drive signal Vout is below approximately 50% of an expected full scale level of the drive signal Vout. Thus the second input signal threshold Vinth2 will be dependent upon the expected maximum or full-scale level or amplitude of the drive signal Vout, which will be dependent on the particular application of the circuitry 500. For example, if the circuitry 500 is for use in a parking sensor system, the expected full scale amplitude of Vout may be greater than if the circuitry is for use in an audio device.

Figure 7:
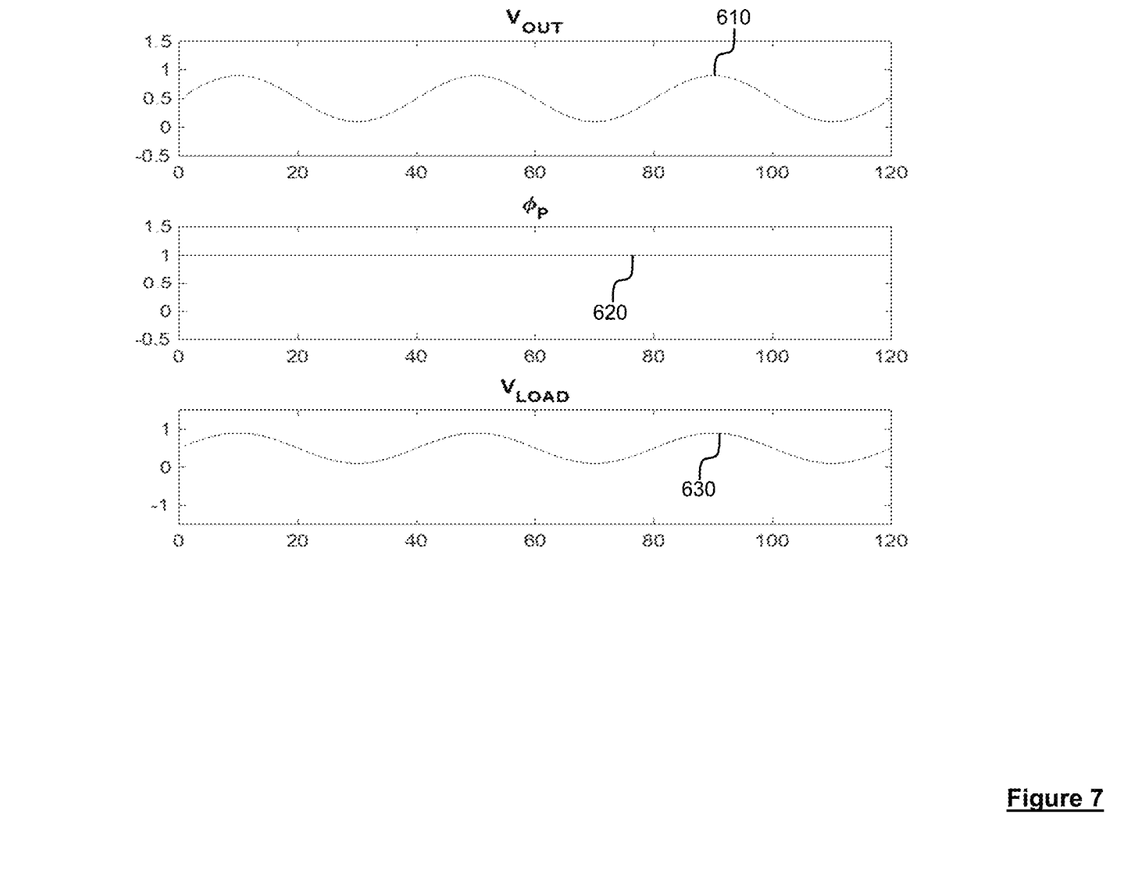
FIG. 7 illustrates a drive signal, a control signal and a voltage across a load during operation of the circuitry of FIG. 6 for a relatively small drive signal.

FIG. 7 illustrates the effect of the offset signal Voffset on the drive signal Vout, the control signal φp and the voltage Vload across the piezoelectric transducer 120 (trace 430) of the circuitry 100 over time. As can be seen from trace 610, the drive signal Vout never reaches 0 volts, and so the drive signal threshold is never met. The effect of this is that the control signal φp (trace 620) remains high, such that commutation does not occur, and the voltage Vload (trace 630) across the piezoelectric transducer 120 tracks the driver output voltage Vout.

It will be noted that in FIG. 7 the drive signal Vout has a different shape than the drive signal Vout in FIGS. 4 and 5, in that trace 610 of FIG. 7 shows an example drive signal having positive and negative half-cycles about a DC offset of approximately 0.5 v, whereas traces 310 and 410 of FIGS. 4 and 5 respectively show example drive signals having only positive half-cycles with no DC offset. This is because in the examples illustrated in FIGS. 4 and 5 the driver circuitry 110 is configured to output a drive signal Vout that is shaped to take into account the effect of the commutation of the drive signal Vout, in order to achieve a desired signal Vload across the piezoelectric transducer 120. In contrast, as commutation does not occur in the example illustrated in FIG. 7, the drive signal Vout need not take into account the effect of commutation, and thus the drive signal Vout can be the same shape as the desired signal Vload across the piezoelectric transducer 120.

In the circuitry 500 of FIG. 6, the driver circuitry 110 maybe selectively configurable to shape the drive signal to take into account the effect of the commutation of the drive signal Vout that occurs at high input signal levels (i.e. when the input signal Vin is equal to or greater than the input signal threshold Vinth).

Thus, in addition to the positive DC offset signal Voffset, the second level detector circuitry 510 may also output a control signal Ctrl to the driver circuitry 110 if the detected input signal level is less than the input signal threshold Vinth, to adjust a configuration of the driver circuitry 110 such that the driver circuitry 110 does not shape the drive signal Vout to take into account the effect of the commutation of the drive signal Vout. If the detected input signal level is equal to or greater than the input signal threshold Vinth, the second level detector circuitry 510 may not output the control signal Ctrl, such that the configuration of the driver circuitry 110 is not adjusted and thus the driver circuitry 110 outputs a shaped drive signal Vout, as in the examples illustrated in FIGS. 4 and 5. In some examples, instead of providing a separate control signal Ctrl, the DC offset signal Voffset may be used as a control signal to adjust the configuration of the driver circuitry 110 such that shaping of the drive signal Vout is not performed. For example, the DC offset signal Voffset could be output to the driver circuitry 110 as the control signal Ctrl. Alternatively, the driver circuitry 110 may be configured to detect the DC offset signal Voffset in the signal Vin+Voffset that is input to the driver circuitry 110, and to adjust the configuration of the driver circuitry 110 to disable shaping of the drive signal Vout if the DC offset signal is detected in this way.

When the level of the input signal Vin changes quickly, there should be a correspondingly quick change in the DC offset signal Voffset, in order to switch between commutating and non-commutating operation of the circuitry 500 with minimal deviation of the signal Vload across the piezoelectric transducer 120 from the desired signal Vload. However, where the input signal Vin is an audio signal for generating an audible output at the piezoelectric transducer 120, a quick change in the DC offset signal Voffset will give rise to audible artefacts in the audible output of the piezoelectric transducer 120.

Figure 8:
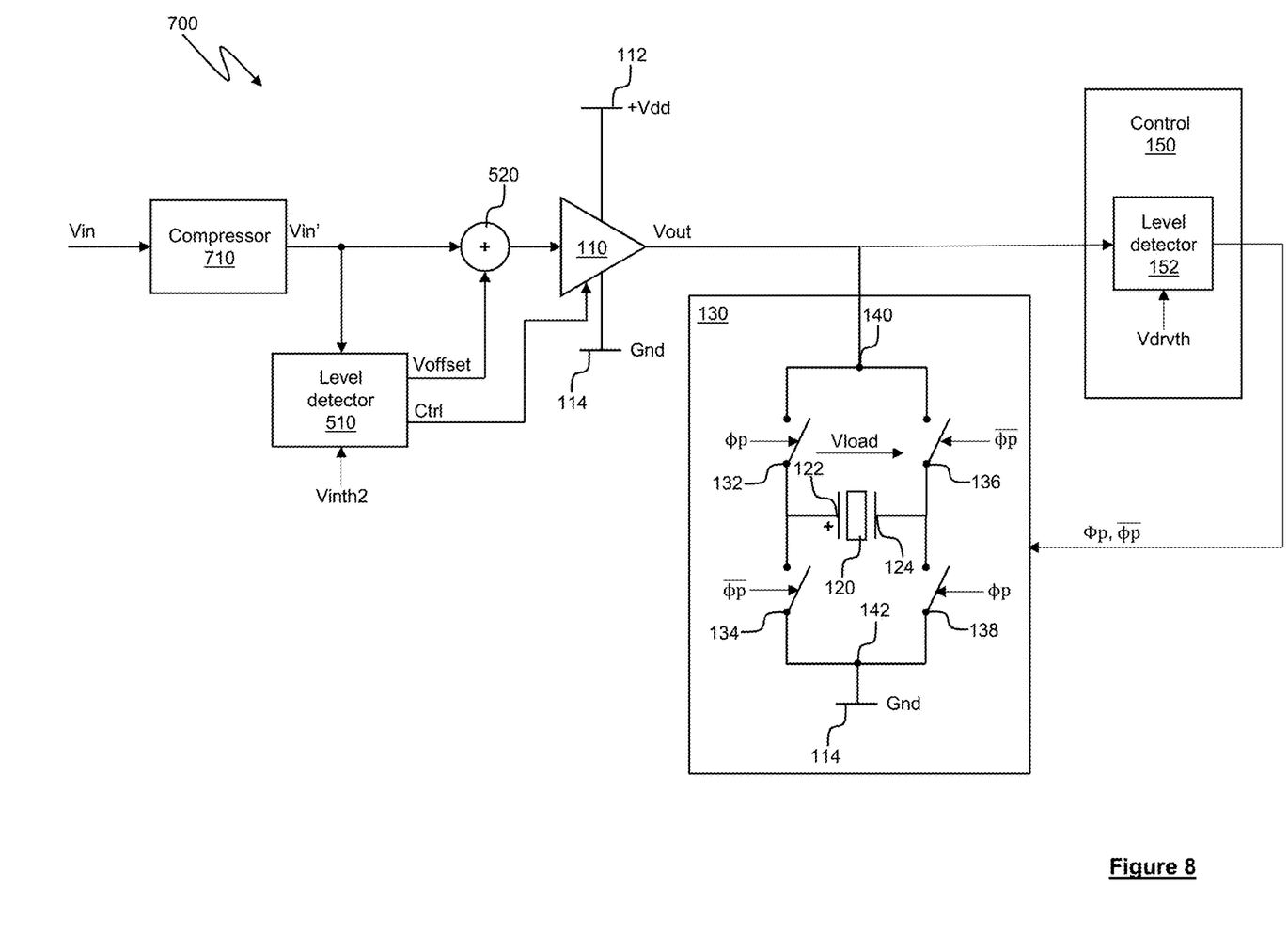
FIG. 8 is a schematic diagram illustrating alternative example circuitry for driving a load such as a piezoelectric transducer according to the present disclosure.

FIG. 8 is a schematic diagram illustrating further example circuitry for driving a load (in this example a piezoelectric transducer) according to the present disclosure, which is configured to mitigate the effects of quick changes in the level of the input signal Vin. The circuitry, shown generally at 700 in FIG. 8, includes a number of elements in common with the circuitry 500 of FIG. 6. Such common elements are denoted by common reference numerals in FIGS. 6 and 8 and will not be described again in detail here. Although in the example shown in FIG. 8 the level detector circuitry 152 of the control circuitry 150 is shown as receiving the drive signal Vout and the drive signal threshold Vdrvth, as in the arrangement shown in FIG. 1, it will be appreciated by those skilled in the art that the level detector circuitry 152 could equally receive the input signal Vin and the first input signal threshold Vinth1, as described above with reference to FIG. 3.

The circuitry 700 includes controllable compressor circuitry 710, which is configured to apply a controllable gain to the input signal Vin to adjust its signal level and to output a level-adjusted version Vin' of the input signal Vin to the second level detector circuitry 510 and the summing node 520, in order to prevent clipping of the drive signal Vout, thus avoiding generating audible artefacts in the audible signal output by the piezoelectric transducer 120.

The gain applied by the compressor circuitry 710 is adaptive, depending upon the level of the input signal Vin.

Thus, where the input signal level increases from a level that is lower than the input signal threshold Vinth to a level that exceeds the input signal threshold Vinth, the compressor circuitry 710 may apply gain to the input signal Vin to reduce its level. Thus instead of falling to zero in a single step, the DC offset Voffset output by the second level detector circuitry 510 is reduced over time (at a rate that is lower than an audio frequency range). As the DC offset Voffset falls, the compressor circuitry 710 continues to adjust the gain applied to the input signal Vin, based on the level of the input signal Vin, thus controlling the DC offset that is applied in order to prevent clipping of the drive signal Vout whilst still maximising the signal level of the signal that is input to the driver circuitry 110.

Similarly, where the input signal level falls from a level that is greater than the input signal threshold Vinth to a level that is less than the input signal threshold Vinth, the compressor circuitry 710 may apply gain to the input signal Vin to increase its level. Thus instead of increasing to a maximum DC offset value in a single step, the DC offset Voffset output by the second level detector circuitry 510 is increased over time (at a rate that is lower than an audio frequency range). As the DC offset Voffset increases, the compressor circuitry 710 continues to adjust the gain applied to the input signal Vin, based on the level of the input signal Vin, thus controlling the DC offset that is applied in order to prevent clipping of the drive signal Vout whilst still maximising the signal level of the signal that is input to the driver circuitry 110.

In this way the DC offset signal Voffset output by the second level detector circuitry 510 can be reduced or increased gradually in a manner that avoids introducing audible artefacts in the audible signal that is generated and output by the piezoelectric transducer 120 in response to the drive signal Vout.

In an alternative approach, instead of adjusting the gain applied by the compressor circuitry 710 as the level of the input signal Vin increases, the gain applied by the compressor circuitry 710 may be adjusted only when the drive signal Vout meets the drive signal threshold Vdrvth, such that the level of the input signal Vin is reduced in response to the drive signal Vout meeting the drive signal threshold Vdrvth.

As will apparent from the foregoing discussion, the circuitry of the present disclosure allows commutation of the drive signal output by the driver circuitry 110 to be effectively disabled at small output signal levels to avoid unnecessary switching losses, power consumption and noise, whilst also permitting commutation to take place for drive signals that require a higher voltage swing across the piezoelectric transducer, e.g. where a relatively large transducer displacement is required.

As discussed above, the DC offset signal Voffset applied to the input signal Vin may be variable according to the detected level of the input signal Vin. This allows the DC offset signal Voffset to be tailored to ensure that the minimum level of the drive signal Vout is just above the drive signal threshold Vdrvth, so as to avoid unnecessary commutation of the output signal, without unnecessarily increasing power consumption.

More generally, in circuitry for driving a piezoelectric transducer (or indeed another load that is capable of handling a DC offset, e.g. a capacitive load), it may be desirable to apply a bias voltage (i.e. a fixed DC offset) to an input signal that is received by driver circuitry which generates, based on the input signal, a drive signal.

For example, in driver circuitry (e.g. the driver circuitry 110) that receives its power supply from positive (+Vdd) and 0 v or ground (Gnd) supply rails, it is common to add a fixed DC offset (e.g. a bias voltage) to an input signal, to reduce the risk of distortion in the output of the driver circuitry caused by clipping of the input signal.

Figure 9:
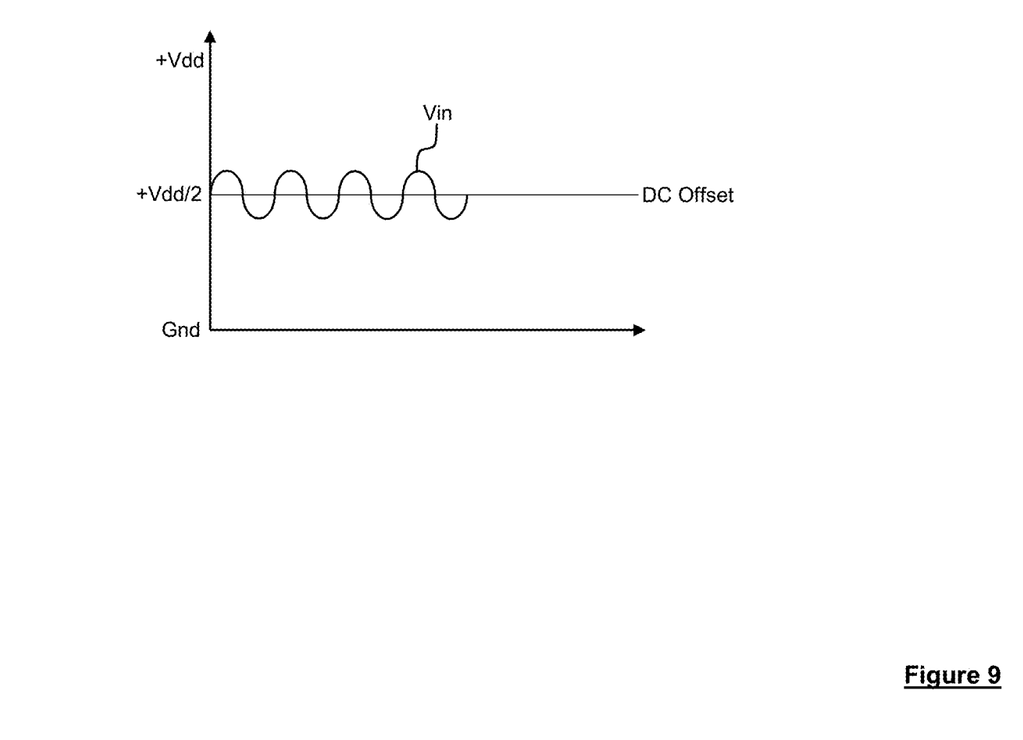
FIG. 9 illustrates the application of a fixed DC offset to an input signal.

Typically the DC offset or bias voltage is set to a value equal to the mid-point between Gnd and +Vdd, i.e. Vdd/2, as shown in FIG. 9, as this provides sufficient headroom to avoid the effects of clipping. However, such an approach results in unnecessary power consumption at smaller (i.e. less than full-scale) input signal levels.

Figure 10:
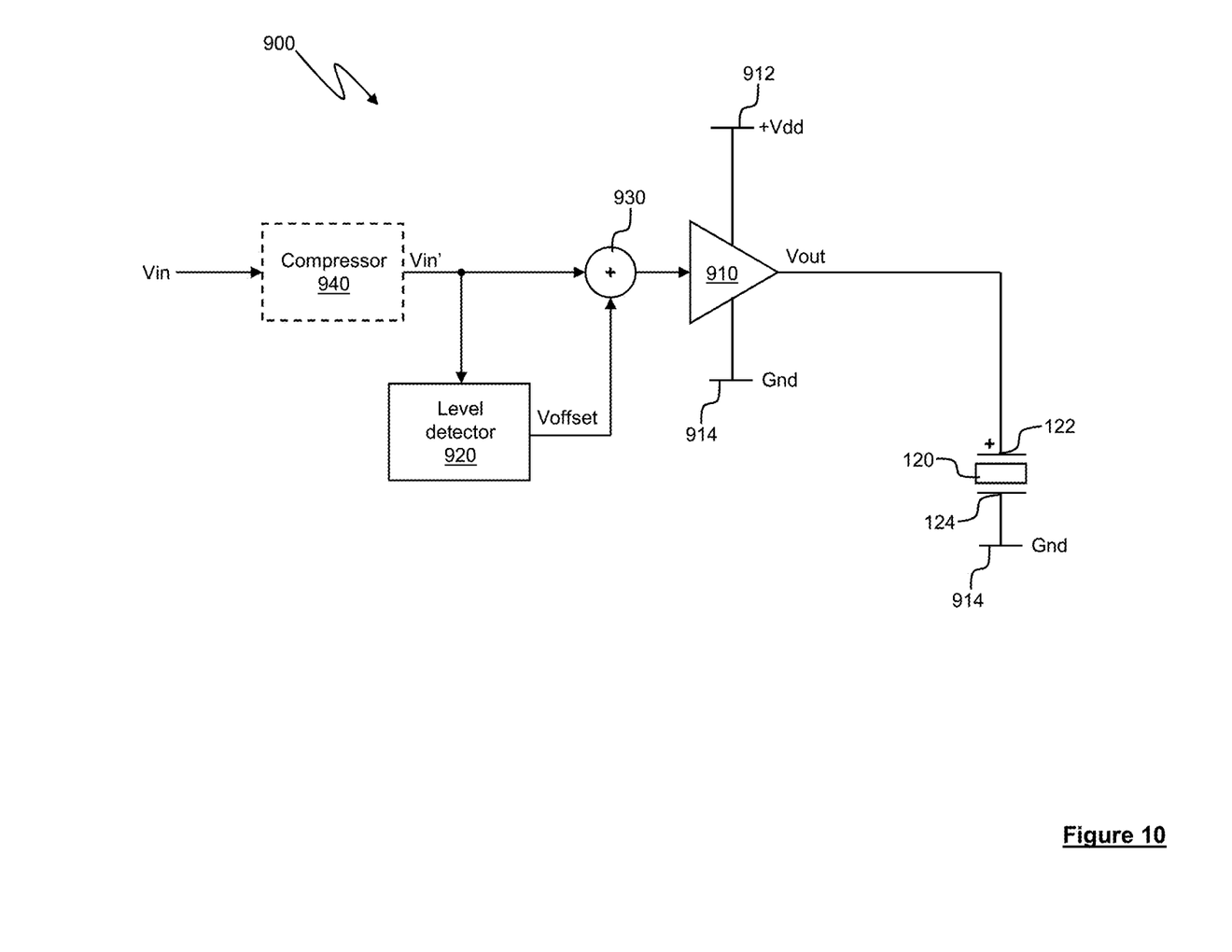
FIG. 10 is a schematic diagram illustrating alternative example circuitry for driving a load such as a piezoelectric transducer according to an aspect of the present disclosure.

FIG. 10 is a schematic diagram illustrating alternative example circuitry for driving a load such as a piezoelectric transducer according to an aspect of the present disclosure.

The circuitry, shown generally at 900 in FIG. 10, includes driver circuitry 910, which in this example receives a power supply from positive (+Vdd) and ground (Gnd) power supply rails 912, 914. The driver circuitry 910 is configured to generate a drive signal Vout, based on an input signal Vin, for driving a load such as a piezoelectric transducer 120 which is coupled between an output of the driver circuitry 910 and the ground supply rail 914.

The circuitry 900 further includes level detector circuitry 920 and a summing node 930. The summing node 930 is configured to receive, at a first input thereof, the input signal Vin, and at a second input thereof an offset signal Voffset output by the level detector circuitry 920. An output of the summing node 930 is coupled to an input of the driver circuitry 910, such that the summing node 930 outputs a signal Vin+Voffset to the driver circuitry 910. As the output Vout of the driver circuitry 910 is based on the signal input to the driver circuitry 910, the drive signal Vout is based on the signal Vin+Voffset that is input to the driver circuitry 910.

The level detector circuitry 920, which may comprise, for example, envelope detector circuitry, is configured to receive the input signal Vin and to detect a level (e.g. an envelope or a volume), of the input signal Vin and to output a DC offset Voffset as a function of the detected input signal level. Thus the level detector circuitry 920 controls the level of the DC offset based on the detected level (e.g. the envelope or volume) of the input signal.

Thus, instead of applying a fixed DC offset or bias voltage to the input signal, the level of the DC offset Voffset output by the level detector circuitry 920 and applied to the input signal Vin can vary, dependent upon a parameter of the input signal (e.g. a level, envelope or volume of the input signal), such that for smaller input signals a lower DC offset can be applied than for larger input signals, whilst still providing a DC offset that is sufficient to avoid clipping.

Figure 11A:
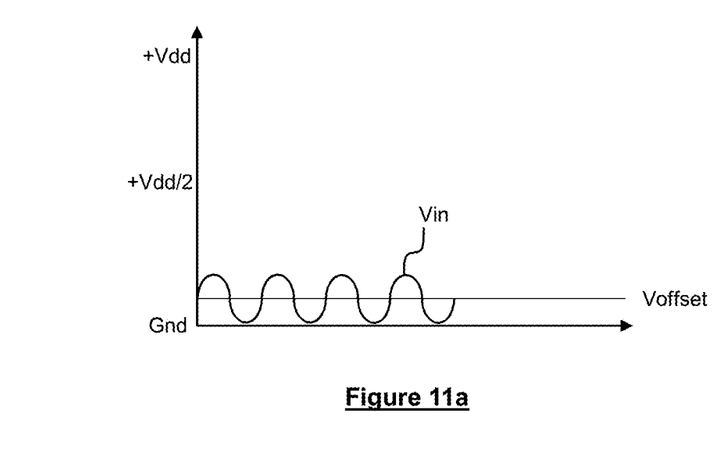
FIGS. 11a and 11b illustrate the application of a variable DC offset to an input signal.
Figure 11B:
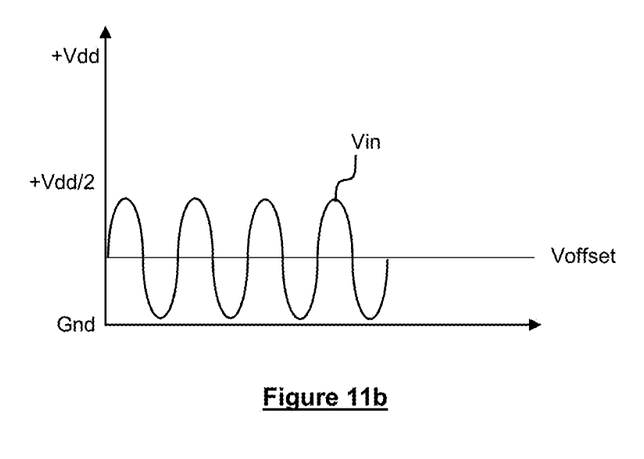

This is illustrated in FIGS. 11a and 11b, which show that the DC offset Voffset output by the level detector circuitry 920 and applied to the input signal Vin varies as a function of the input signal Vin. In the examples shown in FIGS. 11a and 11b the input signal Vin is small, and the level of the DC offset output by the level detector circuitry 920 is just high enough in each example to prevent clipping of the input signal. Thus power consumption is reduced (in comparison with the example shown in FIG. 9) as the DC offset applied to the input signal Vin is no higher than is necessary.

When the level of the input signal Vin changes quickly, there should be a correspondingly quick change in the DC offset signal Voffset. However, where the input signal Vin is an audio signal for generating an audible output at the piezoelectric transducer 920, a quick change in the DC offset signal Voffset will give rise to audible artefacts in the audible output of the piezoelectric transducer 920.

In order to mitigate the effects of quick changes in the level of the input signal Vin, the circuitry 900 may include controllable compressor circuitry 940, which is configured to apply a controllable gain to the input signal Vin to adjust its signal level and to output a level-adjusted version Vin' of the input signal Vin to the level detector circuitry 920 and the summing node 930, in order to prevent clipping of the drive signal Vout, thus avoiding generating audible artefacts in the audible signal output by the piezoelectric transducer 920.

The gain applied by the compressor circuitry 940 is adaptive, depending upon, for example, the level of the input signal Vin or the rate of change of the level of the input signal Vin.

Thus, where the input signal level falls from a level that is greater than some threshold to a level that is less than the threshold, or at a rate that exceeds a threshold rate, the compressor circuitry 940 may apply gain to the input signal Vin to increase its level. Thus instead of reducing the DC offset Voffset output by the level detector circuitry 920 in a single step, the DC offset Voffset output by level detector circuitry 920 is reduced over time (at a rate that is lower than an audio frequency range, e.g. at a rate of 10 Hz or less). As the DC offset Voffset decreases, the compressor circuitry 940 continues to adjust the gain applied to the input signal Vin, based on the level of the input signal Vin, thus controlling the DC offset that is applied in order to prevent.

Similarly, where the input signal level increases from a level that is lower than the threshold to a level that exceeds the threshold, the compressor circuitry 940 may apply gain to the input signal Vin to reduce its level. Thus instead of increasing the DC offset Voffset to a final level appropriate to the new input signal level in a single step, the DC offset Voffset output by the level detector circuitry 920 is increased over time (again at a rate that is lower than an audio frequency range, e.g. at a rate of 10 Hz or less). As the DC offset Voffset increases, the compressor circuitry 940 continues to adjust the gain applied to the input signal Vin, based on the level of the input signal Vin, thus controlling the DC offset that is applied in order to prevent clipping.

In this way the DC offset signal Voffset output by the level detector circuitry 920 can be increased or reduced gradually in a manner that avoids introducing audible artefacts in the audible signal that is generated and output by the piezoelectric transducer 920 in response to the drive signal Vout.

Although the invention has been described in the context of a system in which the load to be driven is a piezoelectric transducer, it will be appreciated that the principles described above are equally applicable to any system that drives a load that is capable of handling a DC offset, in particular capacitive loads.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. Circuitry for driving a load, the circuitry comprising:
   driver circuitry configured to generate a drive signal, based on an input signal to the driver circuitry, for driving the load; and
   commutator circuitry for coupling the driver circuitry to the load, wherein the commutator circuitry is configured to alternate between commutation states in response to a level of the drive signal meeting a drive signal threshold or in response to a level of the input signal meeting a first input signal threshold,
   wherein the circuitry is configured to apply an offset to the input signal when the input signal is below a second input signal threshold so as to increase a minimum level of the drive signal above the drive signal threshold or to increase a minimum level of the input signal above the first input signal threshold.

2. Circuitry according to claim 1, wherein the load comprises a capacitive load.

3. Circuitry according to claim 1, wherein the load comprises a piezoelectric transducer.

4. Circuitry according to claim 1, wherein the second input signal threshold is dependent upon an expected maximum level of the drive signal.

5. Circuitry according to claim 4, wherein the second input signal threshold is such that the commutator circuitry remains in a single commutation state until the level of the drive signal is within 6 dB of the expected maximum level of the drive signal.

6. Circuitry according to claim 1, wherein the offset is a fixed offset.

7. Circuitry according to claim 1, wherein the offset is variable according to a level of the input signal.

8. Circuitry according to claim 1, further comprising level detector circuitry configured to detect a level of the input signal.

9. Circuitry according to claim 8, wherein the driver circuitry is selectively configurable to generate a drive signal that is shaped to take into account the effect of commutation of the drive signal that occurs when the level of the drive signal meets the drive signal threshold.

10. Circuitry according to claim 9, wherein the level detector circuitry is configured to output a control signal to control the configuration of the driver circuitry based on the detected level of the input signal.

11. Circuitry according to claim 8, wherein the level detector circuitry comprises envelope detector circuitry configured to detect an envelope of the input signal.

12. Circuitry according to claim 8, further comprising a summing node configured to receive the input signal and an offset signal output by the level detector circuitry and to output a signal to the driver circuitry.

13. Circuitry according to claim 1, further comprising control circuitry configured to control operation of the commutator circuitry.

14. Circuitry according to claim 13, wherein the control circuitry comprises:
level detector circuitry configured to output a control signal to the commutator circuitry each time the level of the drive signal meets the drive signal threshold.

15. Circuitry according to claim 13, wherein the control circuitry comprises:
level detector circuitry configured to output a control signal to the commutator circuitry each time the level of the input signal meets the first input signal threshold.

16. Circuitry according to claim 1 further comprising controllable compressor circuitry configured to apply a controllable gain to the input signal so as to control a rate of change of the offset applied to the input signal, the controllable gain based on a level of the input signal.

17. An integrated circuit comprising the circuitry of claim 1.

18. A device comprising the circuitry of claim 1, wherein the device comprises a mobile telephone, a tablet or laptop computer, a gaming device, an accessory device, a headset, headphones, earphones, a smart speaker.

19. Circuitry for driving a load, the circuitry comprising:
driver circuitry configured to generate a drive signal, based on an input signal to the driver circuitry, for driving the load;
commutator circuitry configured to commutate the drive signal between first and second terminals of the load; and
level detector circuitry configured to:
detect a level of the input signal; and
compare the detected level of the input signal to an input signal threshold,
wherein the circuitry is configured to disable commutation of the drive signal if the detected level of the input signal is below the input signal threshold.

20. Circuitry for driving a load, the circuitry comprising:
driver circuitry configured to generate a drive signal, based on an input signal to the driver circuitry, for driving the load;
level detector circuitry configured to detect a level of the input signal; and
commutator circuitry for supplying the drive signal to either a first terminal or a second terminal of the load based on an output of the level detector circuitry,
wherein the circuitry is configured to apply an offset to the input signal when the level of the input signal is below a predetermined input signal threshold.

* * * * *